(12) United States Patent
Ticarano

(10) Patent No.: US 6,469,594 B1
(45) Date of Patent: Oct. 22, 2002

(54) ATTENUATION OF ELECTROMAGNETIC NOISE INCLUDING A PERMANENT MAGNET

(75) Inventor: Victor M. Ticarano, Renton, WA (US)

(73) Assignee: Audio Prism, Inc., Redmond, WA (US)

( * ) Notice: Subject to any disclaimer, the term of this patent is extended or adjusted under 35 U.S.C. 154(b) by 0 days.

(21) Appl. No.: 09/477,279

(22) Filed: Jan. 4, 2000

Related U.S. Application Data
(60) Provisional application No. 60/114,956, filed on Jan. 5, 1999.

(51) Int. Cl.[7] .................................................. H03H 7/01
(52) U.S. Cl. ........................ 333/181; 333/12; 336/175; 336/176
(58) Field of Search .......................... 333/181, 12, 182, 333/185; 336/175, 176

(56) References Cited

U.S. PATENT DOCUMENTS

| | | | |
|---|---|---|---|
| 4,347,487 A | 8/1982 | Martin | 333/1 |
| 4,723,188 A | 2/1988 | McMurray | 361/18 |
| 4,816,614 A | 3/1989 | Baigrie et al. | 174/36 |
| 4,873,505 A | 10/1989 | Matsui | 336/92 |
| 4,882,561 A | 11/1989 | Fujioka | 336/65 |
| 4,885,559 A | 12/1989 | Nakano | 336/92 |
| 4,972,167 A | 11/1990 | Fujioka | 336/92 |
| 4,983,932 A * | 1/1991 | Kitigawa | 333/12 |
| 5,349,133 A | 9/1994 | Rogers | 174/36 |
| 5,355,109 A * | 10/1994 | Yamazaki | 336/92 |
| 5,486,803 A * | 1/1996 | Igarashi et al. | 336/92 |
| 5,500,629 A | 3/1996 | Meyer | 333/181 |
| 5,506,909 A * | 4/1996 | Perng | 381/94 |
| 5,548,082 A | 8/1996 | Palmer | 174/34 |
| 5,763,825 A * | 6/1998 | Gilliland | 174/36 |
| 5,814,761 A | 9/1998 | Piazza | 174/35 |
| 6,160,465 A * | 12/2000 | Yamaguchi et al. | 336/110 |

\* cited by examiner

*Primary Examiner*—Robert Pascal
*Assistant Examiner*—Stephen E. Jones
(74) *Attorney, Agent, or Firm*—Chernoff, Vilhauer, McClung & Stenzel, LLP

(57) ABSTRACT

A device and a method for its use to attenuate electromagnetic noise, such as that caused in power supply line current by back-emf from devices being powered, in order to provide cleaner, or more regular alternating current and voltage waveforms. A permanently magnetized magnet is held close to a conductor cable for an alternating current, in a case, which may also hold a permeable material extending from the magnet and at least partly surrounding the cable. Multiple magnets may be included, arranged parallel with each other and with like poles adjacent or facing each other, forming a tubular arrangement about the cable.

10 Claims, 11 Drawing Sheets

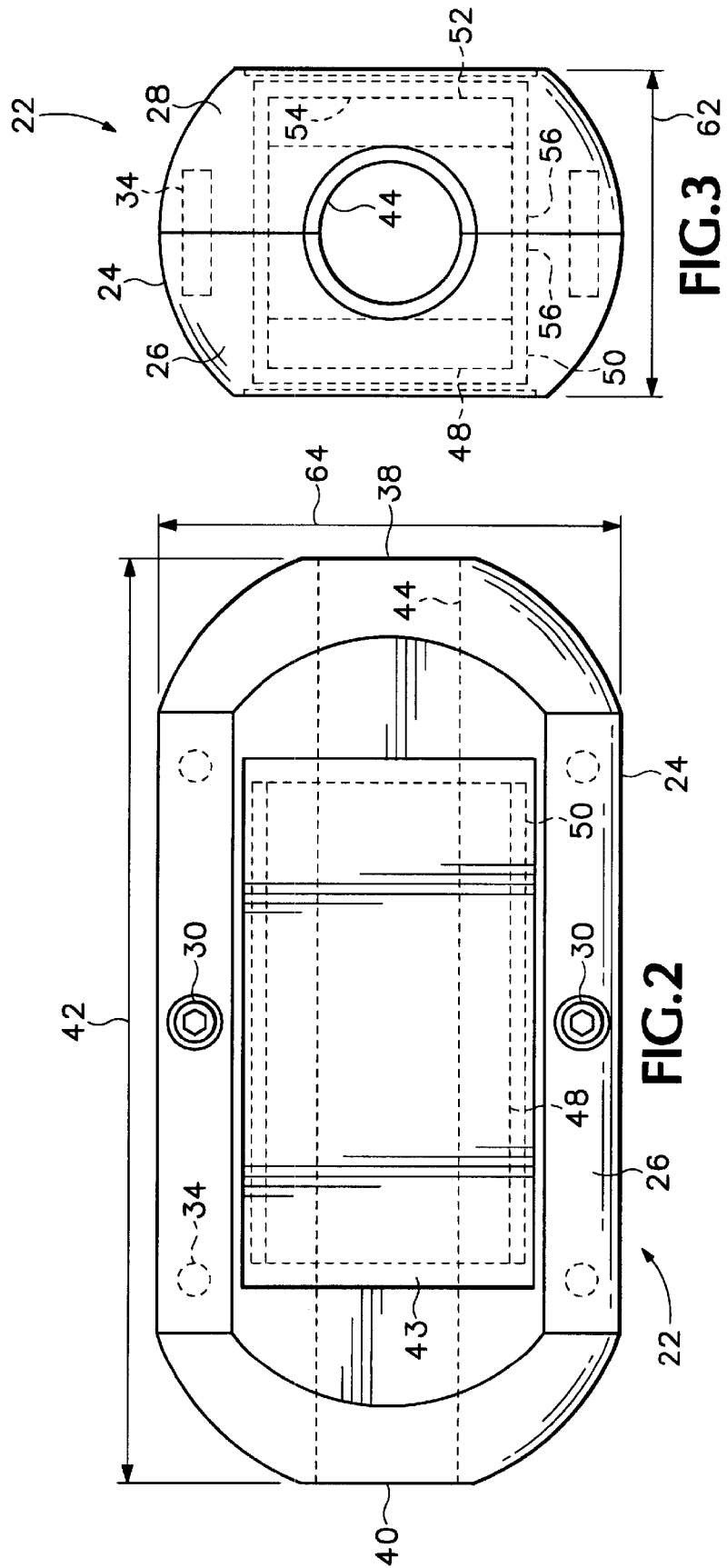

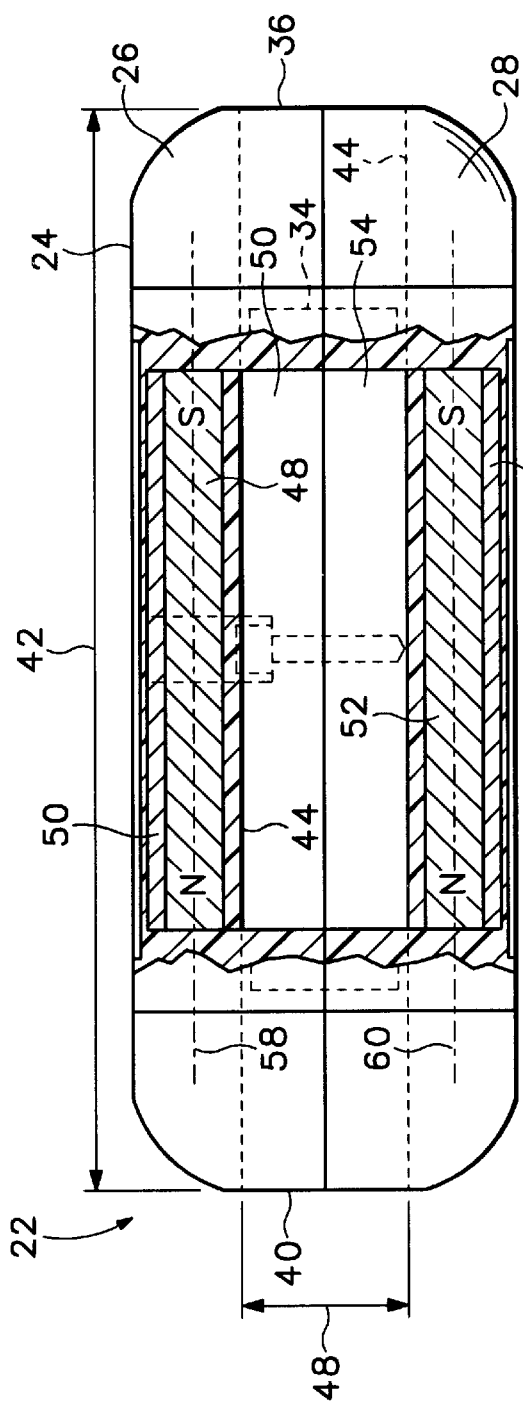
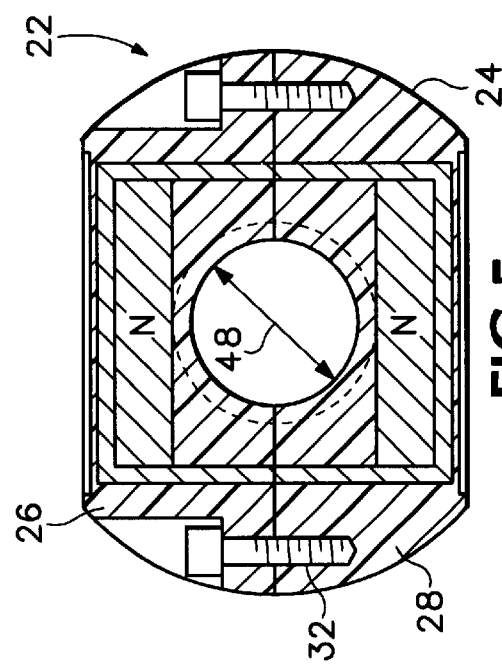

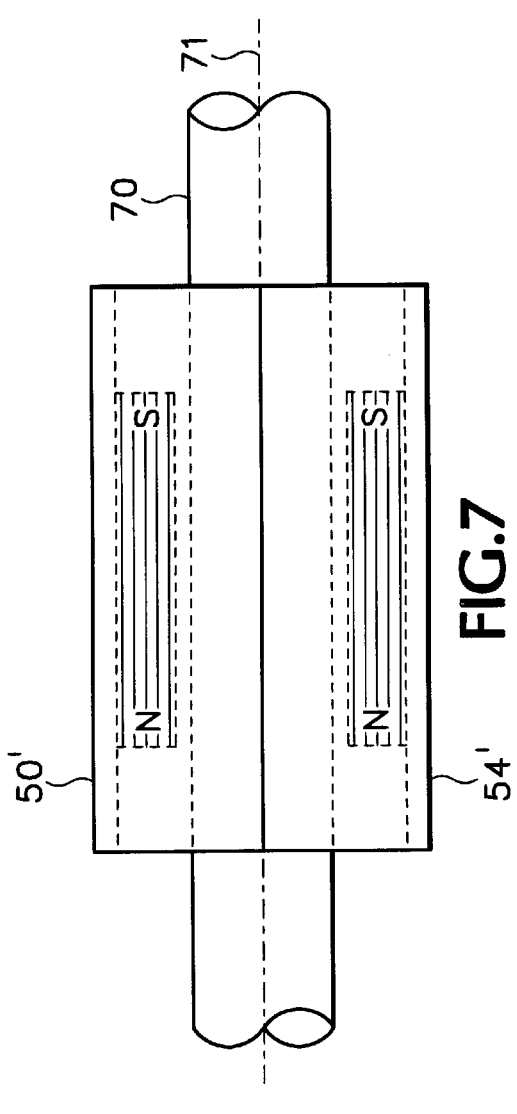
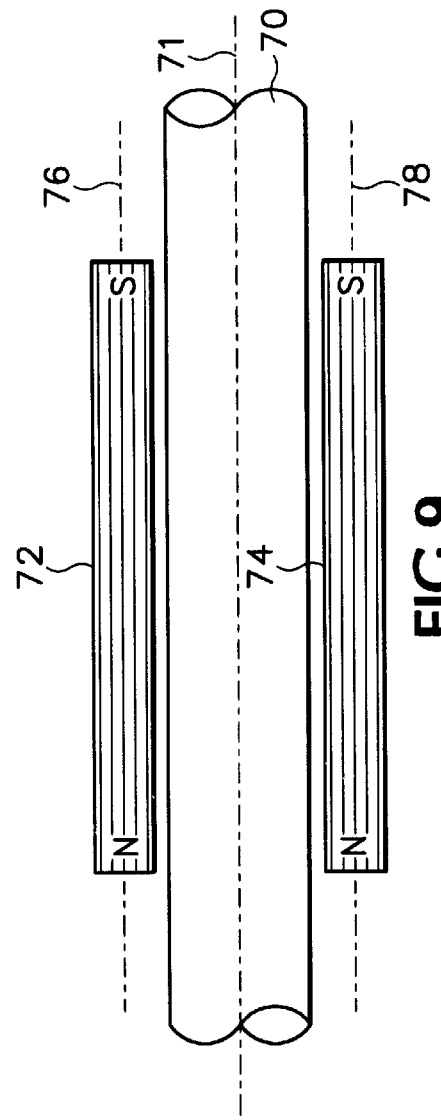
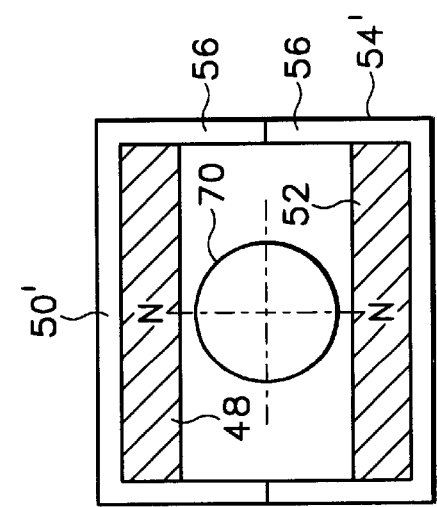
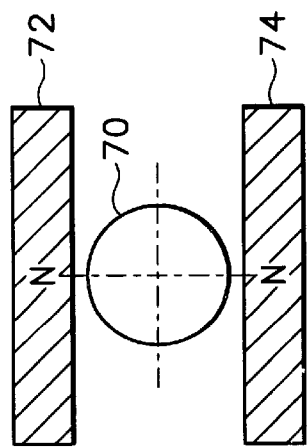
FIG.7
FIG.9
FIG.6
FIG.8

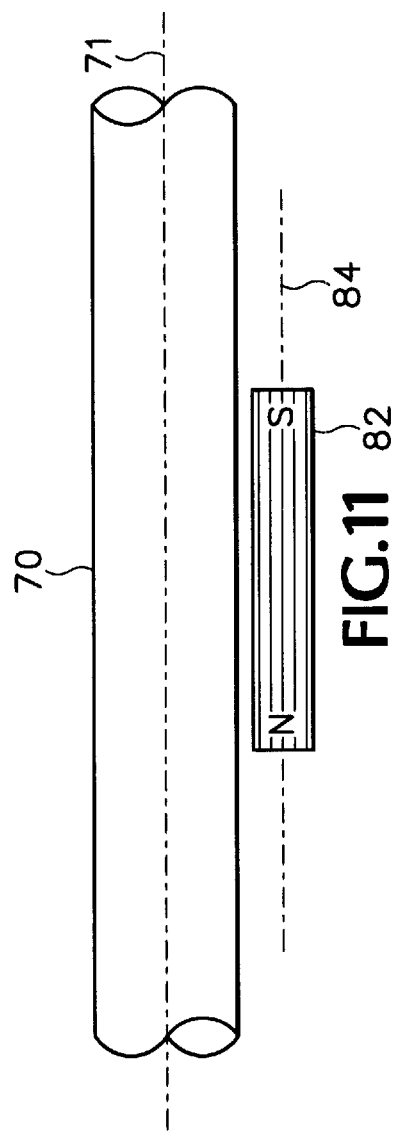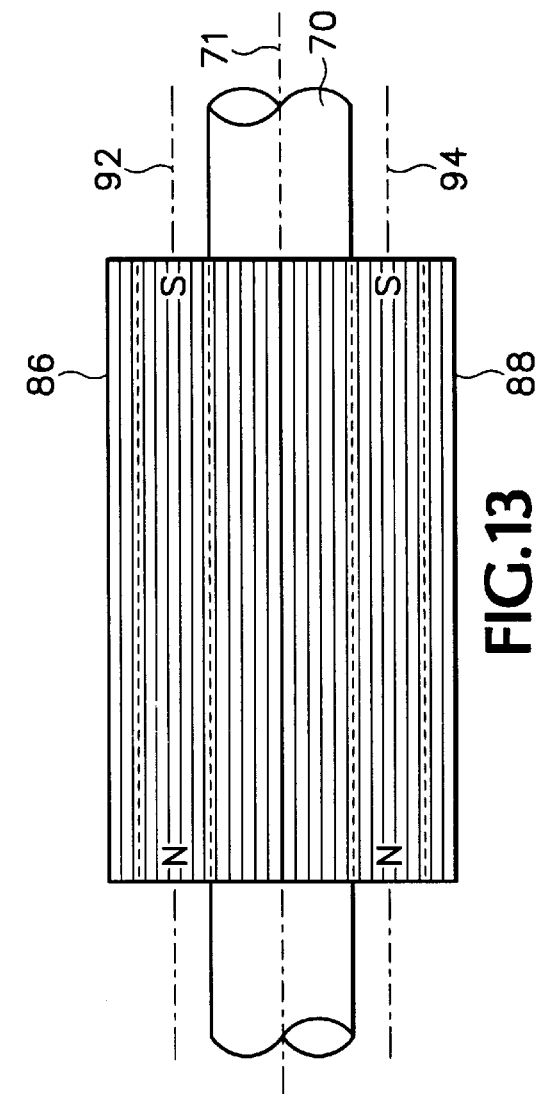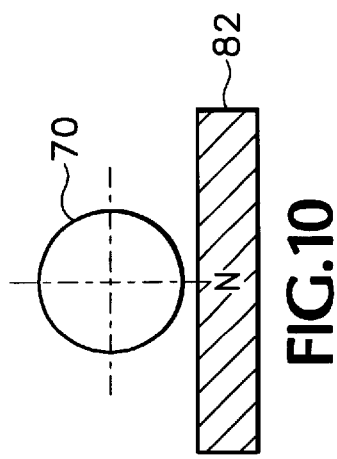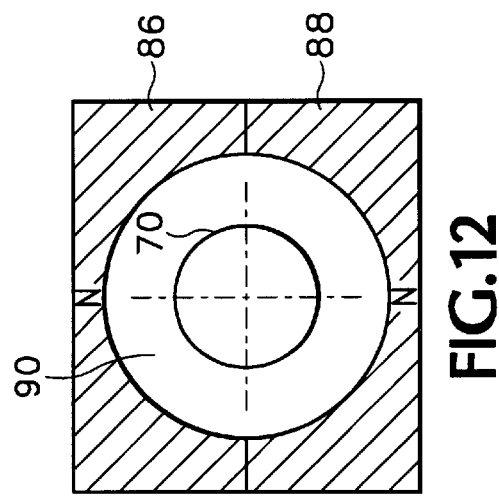

ATTENUATION OF ELECTROMAGNETIC NOISE INCLUDING A PERMANENT MAGNET

This application claims the benefit of U.S. provisional application Ser. No. 60/114,956, filed Jan. 5, 1999.

BACKGROUND OF THE INVENTION

The present invention relates to the attenuation of common mode electromagnetic noise in the vicinity of electrical power, audio signal, and video signal cables, especially noise frequencies below 1 MHz, and in particular relates to attenuation of such noise in consumer and professional audio and video electronics cables.

Although electrical power utility companies attempt to provide a reasonably pure alternating current power supply to their customers, ordinary electrical power circuit wiring acts as an antenna and commercial line power thus is affected by electromagnetic noise originating from many sources. Much of such noise found in electrical power lines is related to the line frequency and its related harmonics and sub-harmonics, and some of such noise is caused by transient currents resulting from power source phase variations brought on by changing loads imposed by motors, etc. Imbalances in the utility transformer circuit of the power line can cause transient direct currents superimposed on the alternating current. All of the above can result in noise in the power line and affect the ideal sine wave form of the alternating current in the power line.

Noise may also be conducted into a power line from consumer electronics or electrically-powered devices. Changing power source loads imposed by power supplies in computers, digital audio electronics, video circuits, amateur radio devices, citizens, band transceivers, and household appliances all can contribute to changing electromagnetic flux fields whose lines of force are cut by a power cable located in the vicinity of such a device, and transient voltages can be fed back into the power source directly from electrical and electronic devices.

The performance of electronic devices can be noticeably affected by the presence of variations in the voltage wave form in the line power supply. In particular, the output of audio and video reproduction devices can be noticeably degraded by noisy power line voltage wave forms. Ferrite materials are commonly used to attenuate common mode circuit noise, as mentioned in Matsui U.S. Pat. No. 4,873,505, Fujioka U.S. Pat. Nos. 4,882,561 and 4,972,167, and Nakano U.S. Pat. No. 4,885,559. It is thus known to place a quantity of magnetizable material in the form of powdered ferrite carried in a matrix of an elastomeric material in the vicinity of a power cable, as mentioned in those patents. A problem with such use of ferrite materials is that the permeability of the material works well only in the higher frequency ranges of 10 MHz to 100 MHz. The ferrite material performs poorly at frequencies between 0 and 1 MHz with respect to attenuating common mode noise in an electrical conductor cable.

It is well known to provide shields of electrically conductive material and layers of ferro-magnetic material surrounding electrical conductor cables located in the vicinity of transient voltages, as disclosed, for instance, in Rogers, U.S. Pat. No. 5,349,133, Baigrie, et al., U.S. Pat. No. 4,816,614, and Palmer U.S. Pat. No. 5,548,082. Such shielding, however, is somewhat costly and is not particularly convenient to use, and it has not been particularly effective in the frequency range from 0 to 1 MHz.

While it is also known to use sophisticated and expensive electronic circuits in the power supply circuits of audio and video electronic devices to eject harmonics and other signals to arrive at a clean internal power supply output, what is desired is a device and a method for its use at a relatively low cost to provide noticeable improvement in the performance of electronic devices by attenuating the effects of electromagnetic noise on power cables, audio signal cables, and video signal cables.

SUMMARY OF THE INVENTION

The present invention provides an answer to the aforementioned need for a method and a device of relatively low cost for attenuating noise caused by incidental electromagnetic fields and stray or transient currents in alternating current cables and audio or video signal cables, through placement of a permanently magnetized magnet, preferably of relatively high field strength, in close proximity to an electrical conductor cable in which it is intended to attenuate electromagnetic noise from a desired signal. Use of the method and apparatus of the invention results in noticeable improvement in the audio and video output performance of electronic devices.

According to the present invention a permanent magnet may preferably be placed and retained as closely practical alongside an electrical conductor cable, with an axis extending between the poles of the magnet oriented generally parallel with the length of the cable.

In accordance with the method of the present invention a permanently magnetized magnet may be so located and held in proximity to a cable providing main power to an electronic device, a cable carrying alternating current power between a power panel and an electronic device, or an analog or digital signal conductor cable, to produce improvement in the perceived output quality of audio equipment such as CD players and phonographs, or of DVD playback equipment and other video reproduction electronic equipment.

In a device that is one embodiment of the invention a pair of permanently magnetized magnets may be similarly oriented magnetically and kept in place on opposite sides of a conductor cable, with quantities of magnetically permeable magnetic material, such as an appropriately formed sheet of iron, extending around the magnets and the cable to shape a magnetic field surrounding the cable.

Preferably a permanently magnetized magnet and such a piece of magnetic material is contained in each part of a two-part case, which is held together around a cable by suitable fasteners.

In a device that is one embodiment of the invention permanently magnetized material of one or more permanent magnet elements may itself be of a shape to enclose and surround a portion of the length of a cable of two or more electrical conductors, with axes of polarity of such permanent magnet elements extending generally parallel with the portion of the conductor cable along which the permanently magnetized material is located.

In another embodiment of the invention one or more permanent magnets may be located in proximity to a cable, with the poles of the magnet located in such a manner that the lines of force extend predominantly transversely with respect to a longitudinal axis of the cable, but this orientation apparently is less effective than having the axes of polarity parallel with the longitudinal axis of the cable.

While it is not fully understood how the method and apparatus of the present invention provide the desired attenuation of spurious and transient signals imposed on an electronic signal of a predetermined desired wave form and frequency, it appears that the performance of the invention is improved when the field strength of the permanent magnet is greater, and particularly when the field strength in the vicinity of the cable with which such a device according to the present invention is used is at least 1000 Gauss.

It has been found that the present invention is apparently effective with respect to use of a device incorporating the invention on conductor cables including parallel pairs of conductors carrying alternating current, parallel pairs associated with a parallel ground conductor, twisted pairs of conductors, and shielded coaxial pairs of conductors.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2 is a top plan view of the noise attenuator device shown if FIG. 1.

FIG. 3 is a right end view of the electromagnetic noise attenuator device shown in FIGS. 1 and 2, the left end view being a mirror image thereof.

FIG. 4 is a partially cutaway side elevational view of the device shown in FIGS. 1–3.

FIG. 5 is a section view of the device shown in FIG. 1 taken along line 5—5 thereof.

FIG. 6 is a simplified end view of the arrangement of the magnets and shields included in the device shown in FIG. 1, shown together with a length of an electrical conductor cable, the case shown in FIGS. 1–5 being omitted for the sake of clarity.

FIG. 7 is a right side view of the arrangement of magnets and shields shown in FIG. 6, together with a length of electrical conductor cable.

FIG. 8 is a simplified end view of an arrangement of a pair of magnets in accordance with the method of the present invention, together with a length of electrical conductor cable, a case to hold the magnets in place with respect to the cable being omitted for the sake of clarity.

FIG. 9 is a right side view of the arrangement of magnets and length of cable shown in FIG. 8.

FIG. 10 is a simplified end view of a single magnet and a length of electrical conductor cable arranged in accordance with the method of the present invention.

FIG. 11 is a right side view of the length of cable and magnet shown in FIG. 10.

FIG. 12 is an end view of a pair of permanent magnets each defining a semi-cylindrical cavity, arranged in accordance with the method of the present invention, together with a length of electrical conductor cable.

FIG. 13 is a right side view of the magnets and length of cable shown in FIG. 12.

DETAILED DESCRIPTION OF THE PREFERRED EMBODIMENTS

Figure 1:
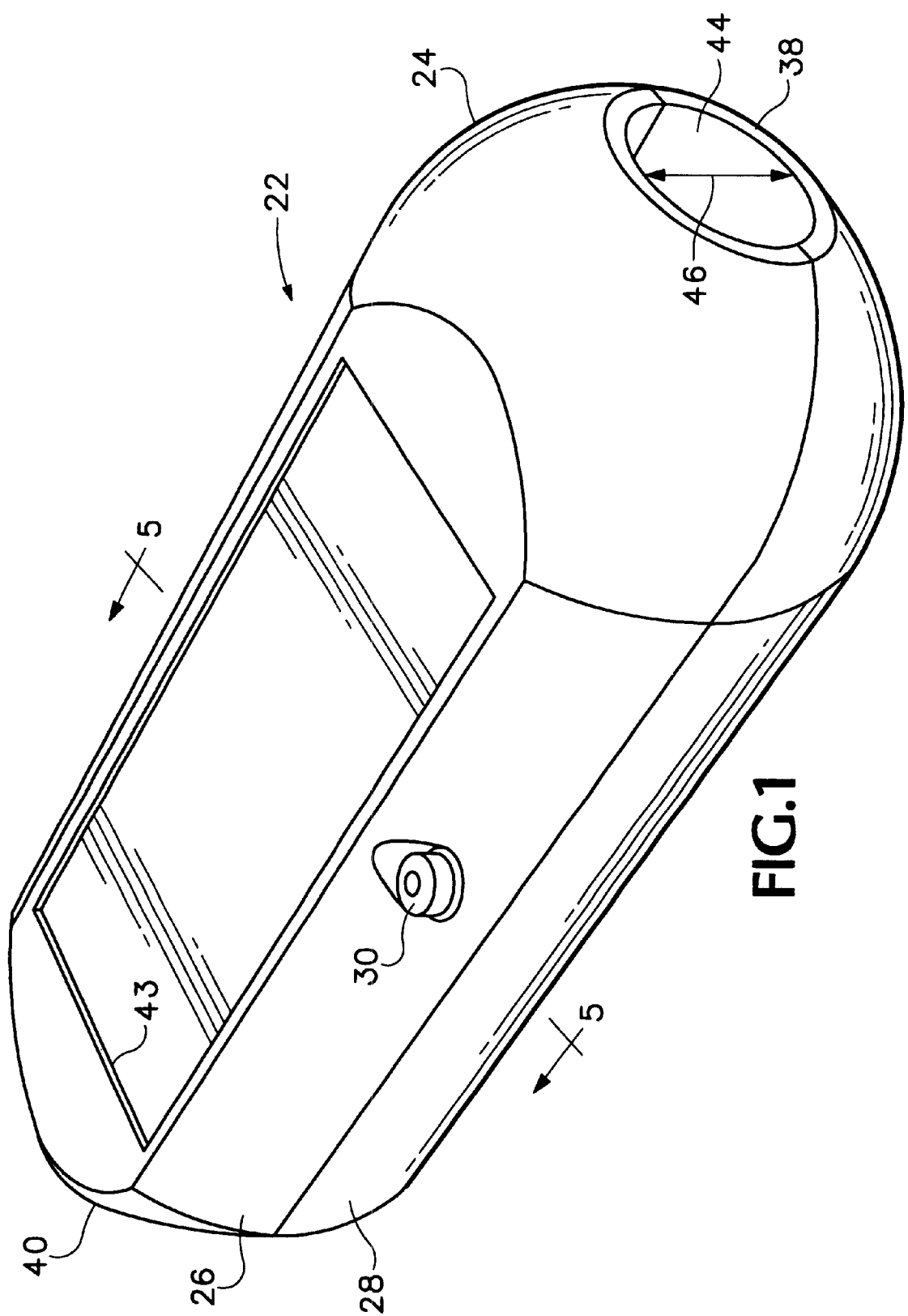
FIG. 1 is a perspective view of an electronic noise attenuator device embodying the present invention.

Referring now to the drawings which form a part of the disclosure herein, and in particular referring to FIGS. 1–5, an electronic noise attenuator 22 includes a case 24 having an upper half 26 and a lower half 28 normally held together by suitable fasteners such as a pair of screws 30 extending through appropriate bores in the upper half 26 into threaded bores 32 in the lower half 28. The upper and lower halves 26, 28 are further kept aligned with each other by suitable pins such as brass pins 34 fitting in corresponding holes in the upper and lower halves 26, 28. The screws 30 and pins 34 should be of non-magnetic material, and the case 24 should similarly be of non-magnetic material. For example, the upper and lower halves 26, 28 of the case may be of a suitable injection-molded synthetic plastic resin.

The case 24 is generally elongate and has a pair of aesthetically rounded opposite ends 38 and 40, resulting in a length 42, which may in one preferred embodiment of the invention be about four inches. A slightly depressed flat surface 43 may be provided on each half of the case 24 as a location for a label. The upper and lower halves 26 and 28 of the case 24 define respective halves of a cylindrical cable-receiving passageway 44 extending along a central longitudinal axis of the case 24. The cable-receiving passageway 44 may have a diameter 46 of, for example, about 0.625 inch, in order to accommodate a power cable of ample size for a powerful audio amplifier. The attenuator 22 can thus be assembled with a cable (not shown in FIGS. 1–5) extending through the case within the cylindrical cable-receiving passageway 44 by attaching the upper half 26 tightly to the lower half 28 and fastening the halves of the case 24 together with the screws 30.

A permanent magnet 48 and a shield member 50 of magnetically permeable ferro-magnetic material, which is preferably electrically conductive, are fixedly located in the upper half 26, as by being included in the molded plastic resin material of the upper half 26 during its manufacture, or by being potted in place within a partially manufactured upper half 26, with the respective. portion of the cylindrical cable-receiving passageway 44 being formed along the magnet 48. Similarly, a magnet 52 and a shield member 54 are fixedly located in the lower half 28 of the case 24.

Preferably, the magnets 48 and 52 are located along, parallel with, and closely adjacent to the cylindrical cable-receiving passageway 44, and the shield members 50 and 54 extend respectively along surfaces of the magnets 48 and 52 that face away from the cable-receiving passageway 44. A thin layer of the material of the upper half 26 and lower half 28, or potting material retaining the magnets 48 and 52 in place in those parts of the case 24, is present between the surface of the cable-receiving passageway 44 and the surface of the magnet 48 or 52.

The shield members 50 and 54 generally have the form of channels of extruded or folded sheet metal, thick enough not to be magnetically saturated by the flux of the respective magnet. For example, the shield members 50 and 54 may be of a suitable magnetic steel, such as cold rolled steel. Each has a pair of legs 56 extending beyond the respective magnet toward the mating faces of the upper half 26 and lower half 28. Preferably, the shield members 50 and 54 are so located within the upper half 26 and lower half 28 that the margins of the legs 56 abut against each other or are separated by a minimum of space when the upper half 26 and lower half 28 are fastened together by the screws 30.

The magnets 48 and 52 are preferably similar to each other, and for the sake of simplified manufacture they may be of generally rectangular bar magnet configuration. Their opposite north and south pole faces are located respectively near the ends 40 and 38 of the case 24, so that linear axes 58 and 60, extending between the respective pole faces of each magnet, are parallel with each other and with the central longitudinal axis of the case 24, as may be seen in FIG. 4. The magnets 48 and 52 are thus aligned parallel with each other and with like poles adjacent each other. That is, the north pole faces of both magnets 48 and 52 are located nearer to the left end 40 of the attenuator 22 as shown in FIG. 4, while the south pole faces of both of the magnets 48 and 52 are located adjacent, i.e., opposite, each other near the right end 38 of the attenuator 22 as shown in FIG. 4. The screws 30 and threaded bores 32 thus must be adequate to overcome the mutual repulsion of the magnets 48 and 52.

Preferably the magnets 48 and 52 are made of a material which is permanently magnetizable and resists being demagnetized, and which when magnetized produces a reasonably high magnetic flux, as it appears that the effectiveness of the attenuator 22 as used on power cables increases with the strength of the magnets utilized. While some improvement is perceptible in the performance of a sound reproduction system using magnets producing a field as small as 1000 Gauss surrounding a power cable, a stronger field is preferable.

To suitably enclose the magnets 48 and 52 and their associated shields 50 and 54, the case 24 may have a height 62 of about 1.425 inch, for example, and to accommodate the threaded bores 32 and pin holes 36 the case 24 may have a width 64 of about 1.95 inch.

Preferably, the shield members 50 and 54 extend over at least the same length as the respective magnet 48 and 52 with which each is associated, so that with the margins of the legs 56 of the shields 50 and 54 abutting each other the combined shield members 50 and 54 substantially enclose the magnets 48 and 52, except the portions thereof facing toward the ends 38 and 40 of the attenuator 22. It will be appreciated that for different cable sizes it may be desired to have a cable receiving passageway 44 of different sizes and for the shield members to have leg portions of different sizes to have the magnets 48 and 52 be located close to the cable.

Referring next to FIGS. 6 and 7, the magnets 48 and 52 and shield members 50' and 54' are shown in their respective positions with respect to a cable 70, with the case 24 omitted for the sake of clarity. It should be realized that the critical factor is the presence of a permanent magnet in close proximity with the cable 70, preferably, but not necessarily, aligned so that an axis of polarity, extending directly between the opposite poles of the magnet, extends generally parallel with the length of the conductors of the cable in which it is desired to attenuate electromagnetic noise in accordance with the present invention. Accordingly, a case, as such, is not necessary to the practice of the invention, and other ways such as adhesives or fasteners acting directly to hold the magnets and any shields may be used.

Referring next to FIGS. 8 and 9, magnets 72 and 74 are located on opposite sides of a cable 70, again with like poles of the magnets 72 and 74 adjacent each other on opposite sides of the cable 70 and with axes of polarity 76 and 78 of the magnets parallel with each other and with the longitudinal axis 71 of that portion of the cable.

While it is preferred to use at least a pair of magnets as shown in previously described figures, beneficial results can be obtained using a single magnet such as the magnet 82 in proximity with the cable 70 as shown in FIGS. 9 and 10. Again, it is preferable to have the axis of polarity 84 of the magnet 82 aligned parallel with the longitudinal axis 71 of that portion of the cable 70 with which the magnet 82 is associated.

It is not required for the magnets utilized in accordance with the method of the present invention to be bar magnets, and satisfactory results will also be obtained by using magnets of a shape including in the permanently magnetized material itself the shape of a cable-receiving passageway 90. As shown in FIGS. 12 and 13, a pair of magnets 86 and 88 may be fashioned, for example, of an extrudable permanently magnetizable material such as a rare earth magnetic material or a magnetic material embedded in a matrix of a ceramic or synthetic plastic resin material, so that the two magnets 86 and 88 together define the cylindrical cable-receiving passageway 90 within which the cable 70 can be located. As with the previously described arrangements shown in FIGS. 1–9, the magnets 86 and 88 are aligned with each other with their axes of polarity 92 and 94 parallel with each other and with the longitudinal axis of the cable 70.

Figure 14:
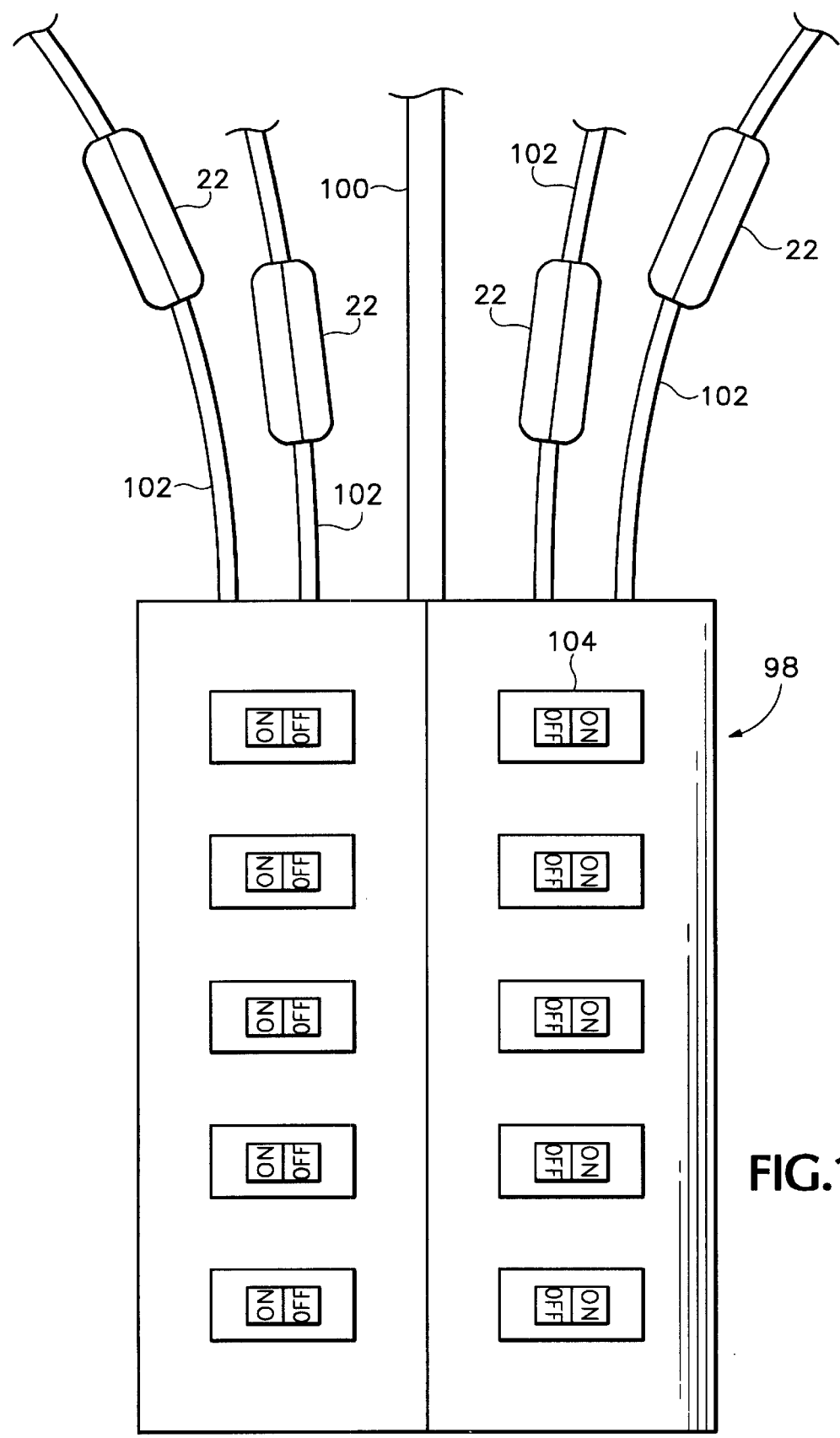
FIG. 14 is a simplified view of an electric power service panel showing the locations of several electromagnetic noise attenuators according to the invention in place on branch electrical power distribution cables in accordance with the method of the invention.

There are numerous locations where electromagnetic noise attenuation devices may be advantageously used according to the invention. In FIG. 14 a service panel 98 receives line AC current through a supply cable 100 and provides distributed power through output cables 102 each connected to the supply cable 100 or disconnected therefrom by a respective on/off switch 104. A respective electromagnetic noise attenuator 22 located on each of the output cables 102 attenuates noise in the respective one of the output cables 102, in order to improve the output from electronic devices receiving power from the output cables 102.

Figure 15:
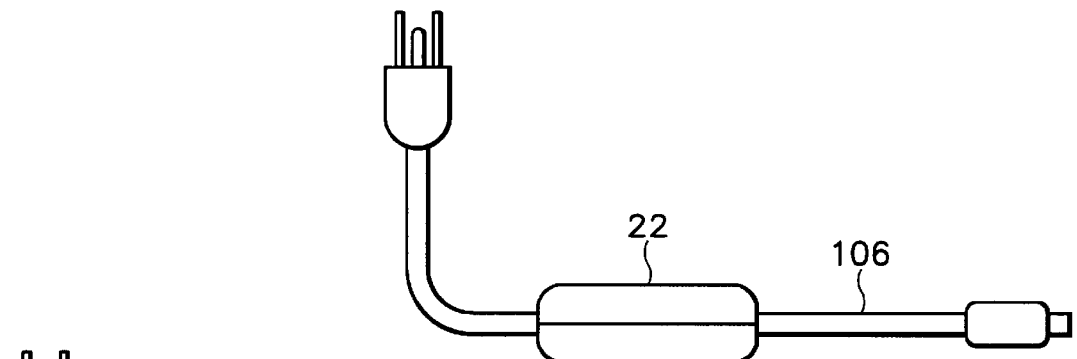
FIG. 15 is a simplified pictorial view of an electromagnetic noise attenuator device according to the present invention in place on a detachable AC power cord for an electronic device.
Figure 16:
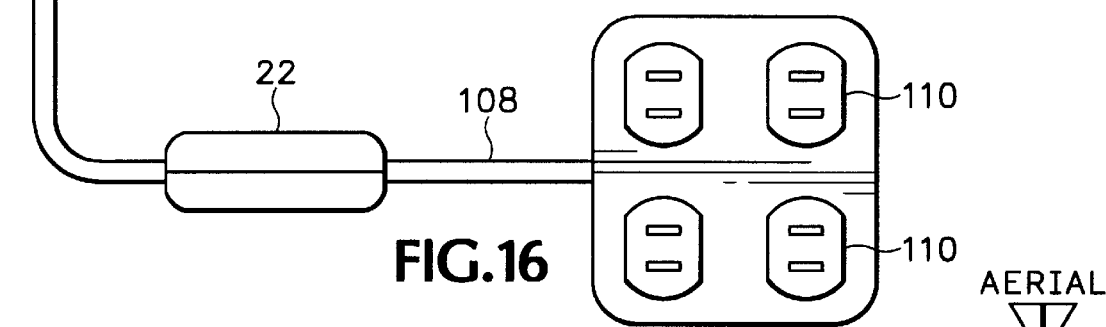
FIG. 16 is a simplified pictorial view of an electromagnetic noise attenuator device according to the present invention in place on an AC power extension cord equipped with multiple power outlet sockets.

Electromagnetic noise attenuators 22 may also be useful on a detachable AC power cord 106, shown in FIG. 15, for an electronic device. Similarly, a utility distribution AC power cord 108 with multiple output power sockets 110 is an appropriate location for usage of an electromagnetic noise attenuator device 22 according to the present invention, as shown in FIG. 16.

Figure 17:
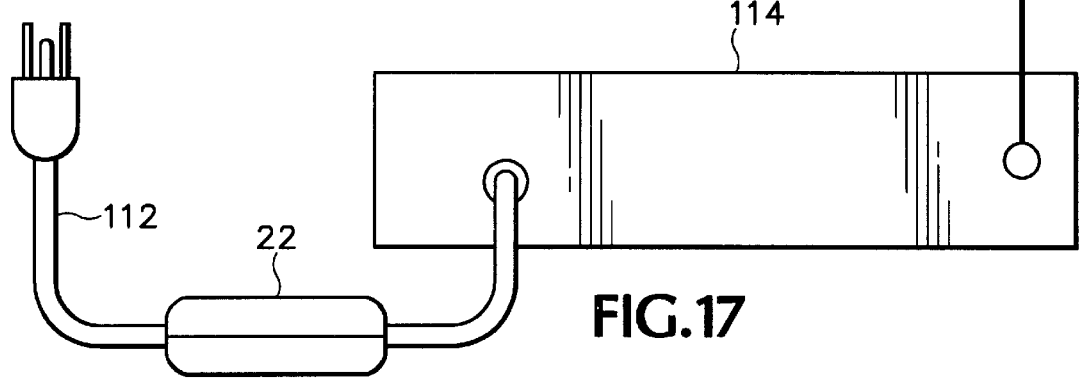
FIG. 17 is a simplified pictorial view of an electromagnetic noise attenuator device according to the present invention in place on the AC power cord of a radio receiver.
Figure 18:
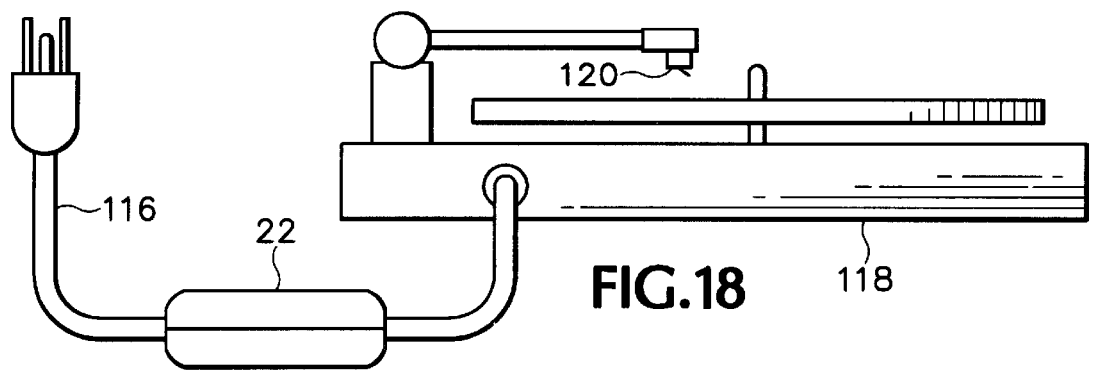
FIG. 18 is a simplified pictorial view of an electromagnetic noise attenuator device according to the present invention in place on the AC power cord of a phonograph turntable.
Figure 19:
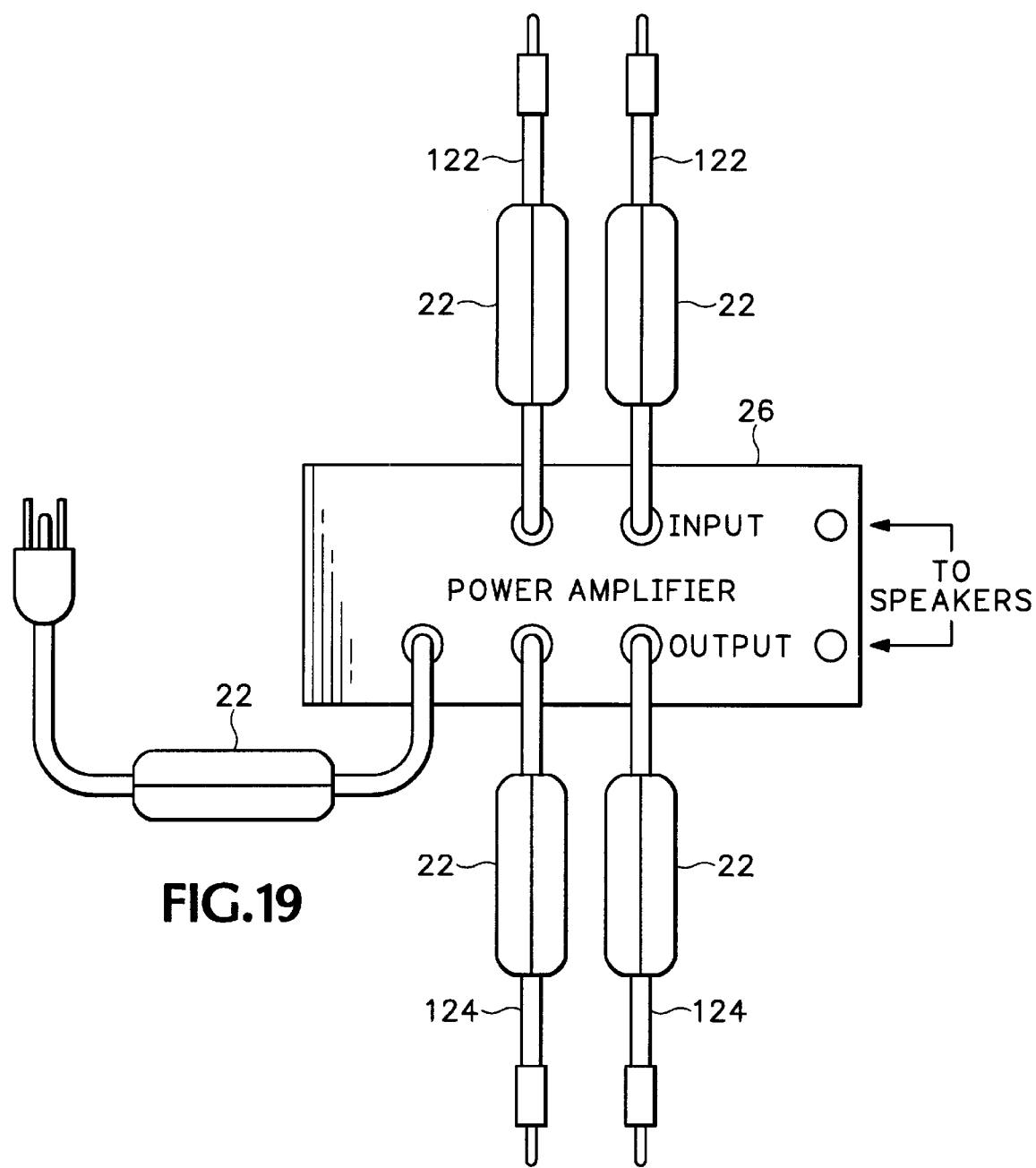
FIG. 19 is a simplified pictorial view showing the location of multiple electromagnetic noise attenuators according to the present invention in place on the AC power cord, input signal cables, and output signal cables of an amplifier.

An electromagnetic noise attenuator 22 is also appropriately used on the AC power cord 112 of a radio receiver such as an FM tuner/receiver 114, as shown in FIG. 17, or on the AC power cord 116 of a phonograph turntable 118, as shown in FIG. 18. Because of the shielding provided around the magnets 48 and 52 in the electromagnetic noise attenuator 22, the attenuator 22 does not cause any adverse effects on the performance of a phonograph pick-up cartridge 120.

Not only is the electromagnetic noise attenuator 22 useful on power cords as previously shown, but such a device can also be useful on cables carrying audio signals, such as the coaxial input cable 122 and coaxial output cables 124 of an amplifier such as a power amplifier 126, resulting in noticeable improvement in the output sound quality from a loudspeaker (not shown) driven by the amplifier 126.

Figure 20:
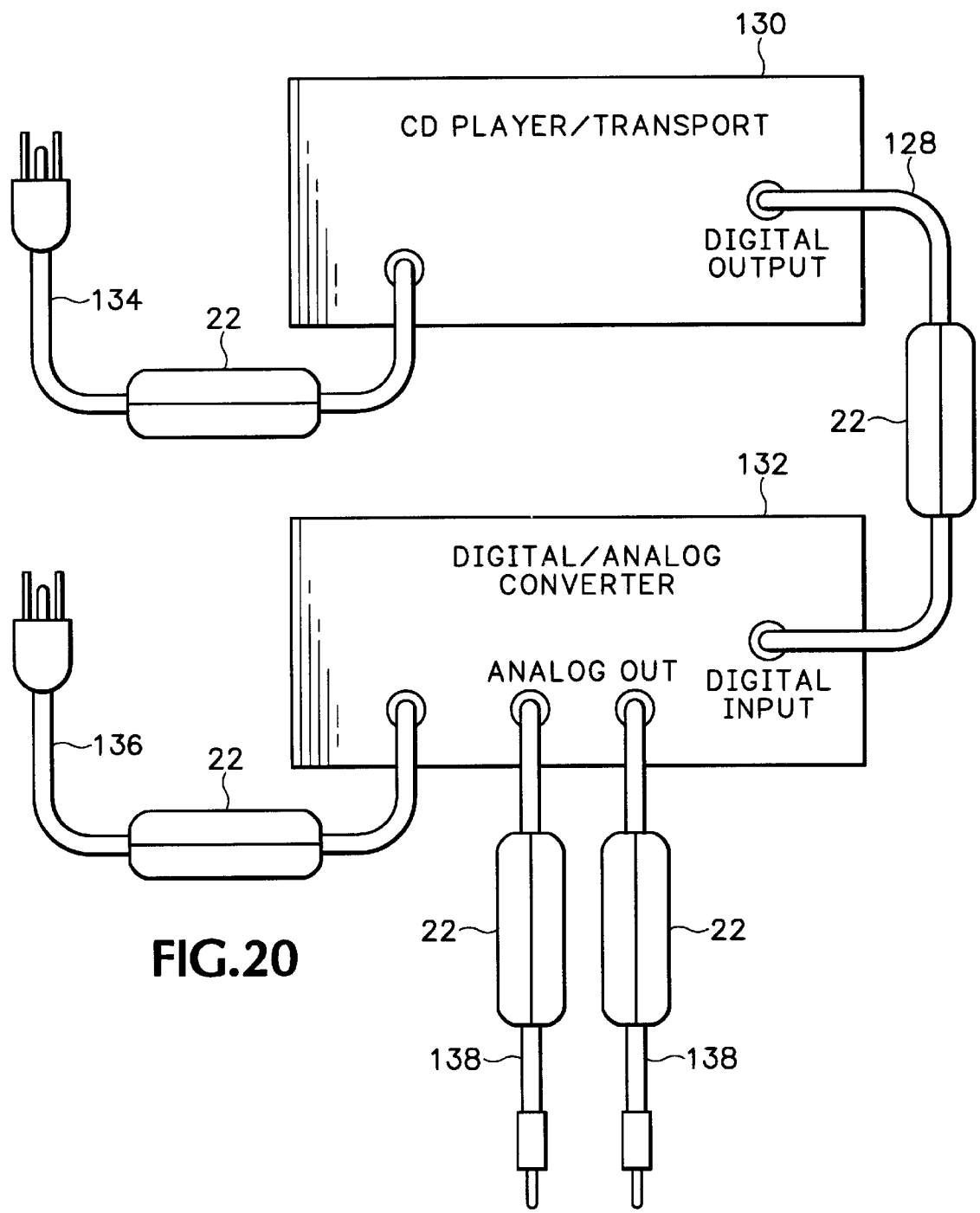
FIG. 20 is a simplified pictorial view of several electromagnetic noise attenuator devices according to the present invention in use in accordance with the method of the present invention on AC power cords, a digital signal cable, and analog signal output cables of a sound reproduction system including a CD player and a digital-to-analog converter.
Figure 21:
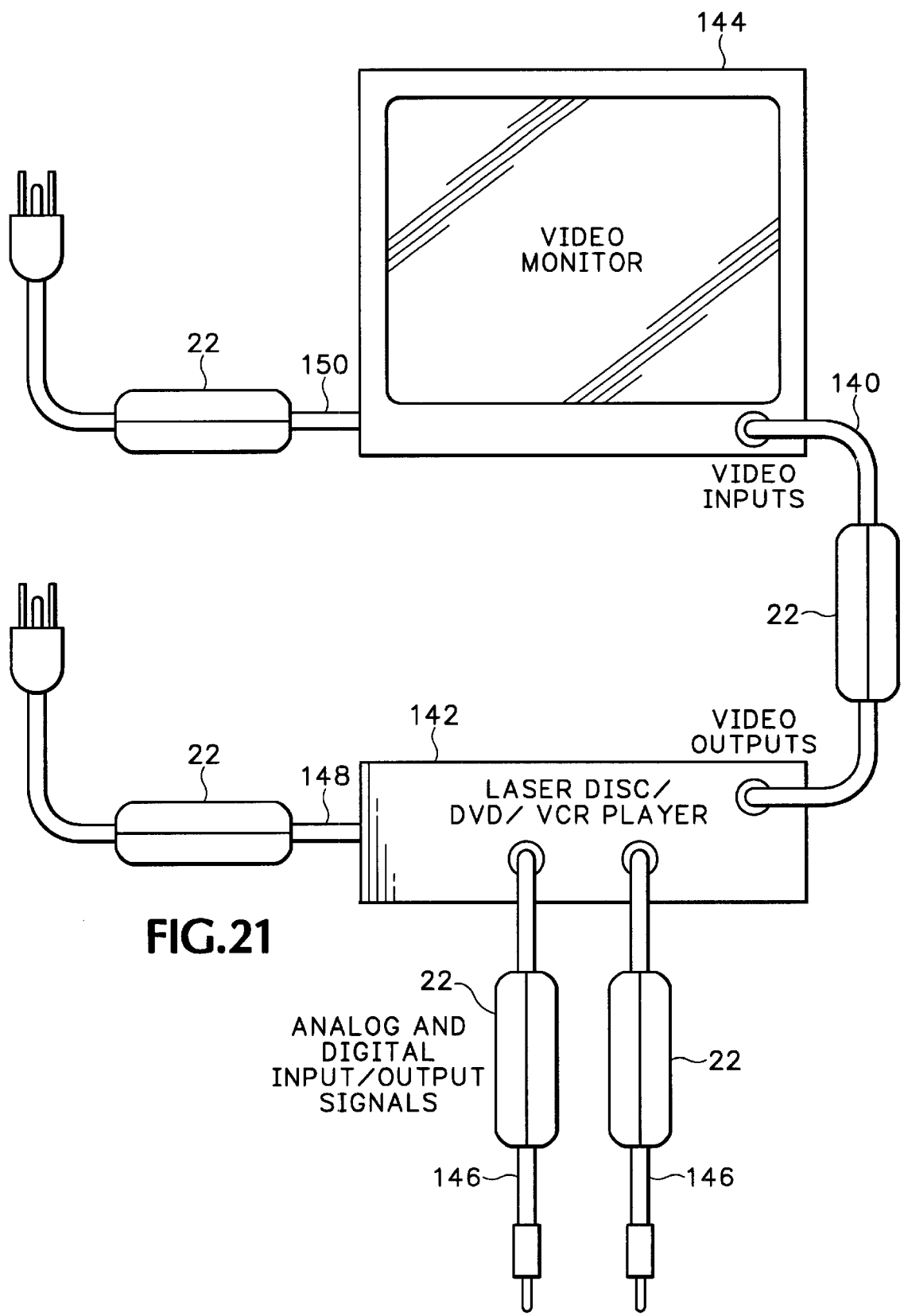
FIG. 21 is a simplified pictorial view of several electromagnetic noise attenuator devices according to the present invention in use in accordance with the method of the present invention on the AC power cords of a video monitor and an electronic device providing video output signals, as well as on analog and digital signal cable connected therewith.
Figure 22:
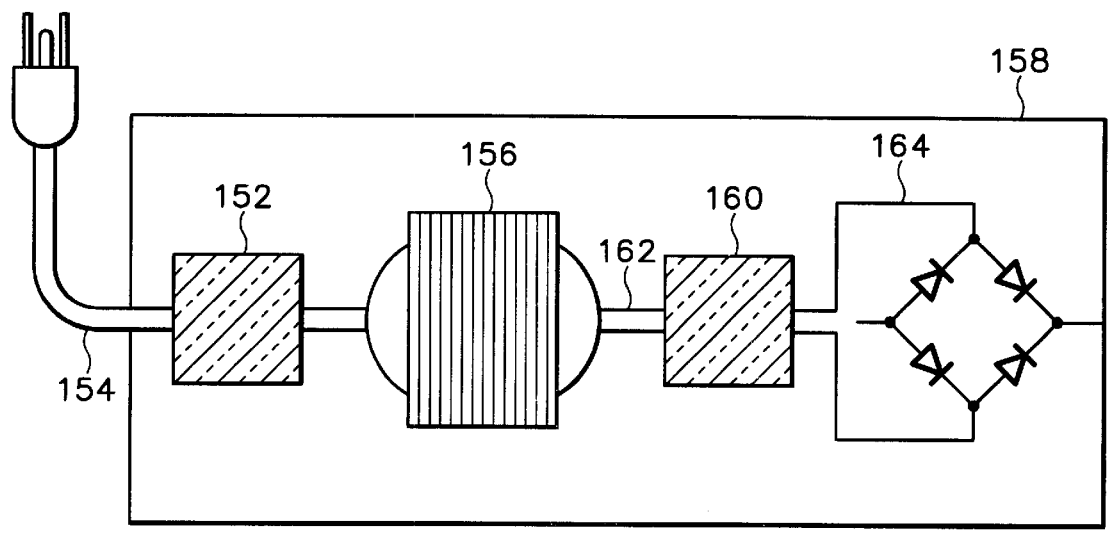
FIG. 22 is a simplified view of an electronic device including a power transformer and circuitry driven by the output from the power transformer secondary side, with electromagnetic noise attenuator devices according to the present invention within the chassis of the electronic device.

The electromagnetic noise attenuators 22 according to the present invention are also useful in connection with digital signal cables, such as the digital signal transmission cable 128 interconnecting a CD player 130 with a digital-to-analog converter 102, and on the power supply cords 134 and 136 to the CD player 130 and the digital-to-analog converter 132 respectively, as well as on the analog signal output cables 138 of the digital-to-analog converter 132, as shown in FIG. 20.

The electromagnetic noise attenuator 22 is also useful in connection with video signals as carried by the video signal cable 140 interconnecting a video electronic device 142 such as a laser disc player, digital video disc player (DVD), or video cassette recorder/player (VCR), to provide output signals to a video monitor 144, or in conjunction with signal cables 146 providing digital or analog audio or video signals to or from the electronic device 142. Use of an electromagnetic noise attenuator 22 on the power cables 148 and 150 of the electronic device 142 and video monitor 144 can also provide noticeable improvement in the video display and in the output performance of the electronic device 142.

While the electromagnetic noise attenuator 22 has been shown as applicable to power cables and signal cables externally located with respect to various electronic devices, it is also advantageous to use magnets in close proximity to electrical conductor cables within an electronic device in accordance with the invention. In this fashion, an electromagnetic noise attenuator 152 including permanently magnetized magnetic material is located in proximity to the input power cable 154 providing line AC current to the primary side of the power transformer 156 in the chassis enclosure of an electronic device 158. Additionally, a second electromagnetic noise attenuator 160 is included in proximity to the output cable 162 from the secondary side of the power transformer 156, between the power transformer 156 and other circuitry 164 of the electronic device 158.

Figure 23:
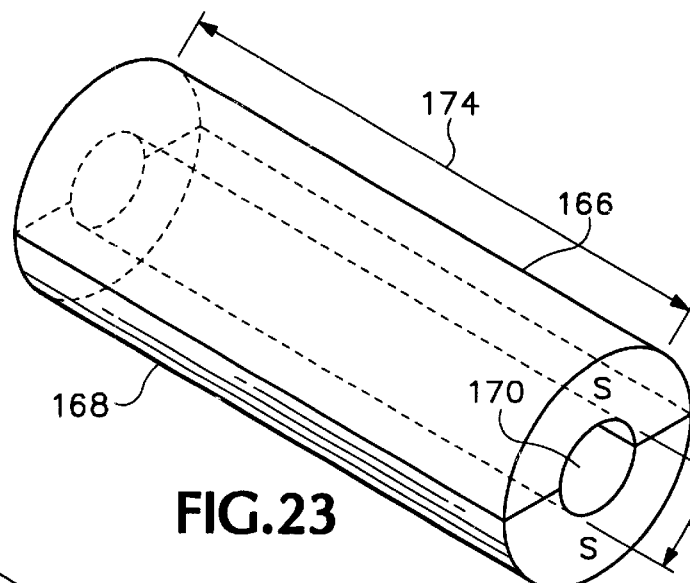
FIG. 23 is a perspective view of a pair of permanent magnets arranged to cooperatively form a cylindrical tube of permanently magnetized material for use in accordance with the present invention.
Figure 24:
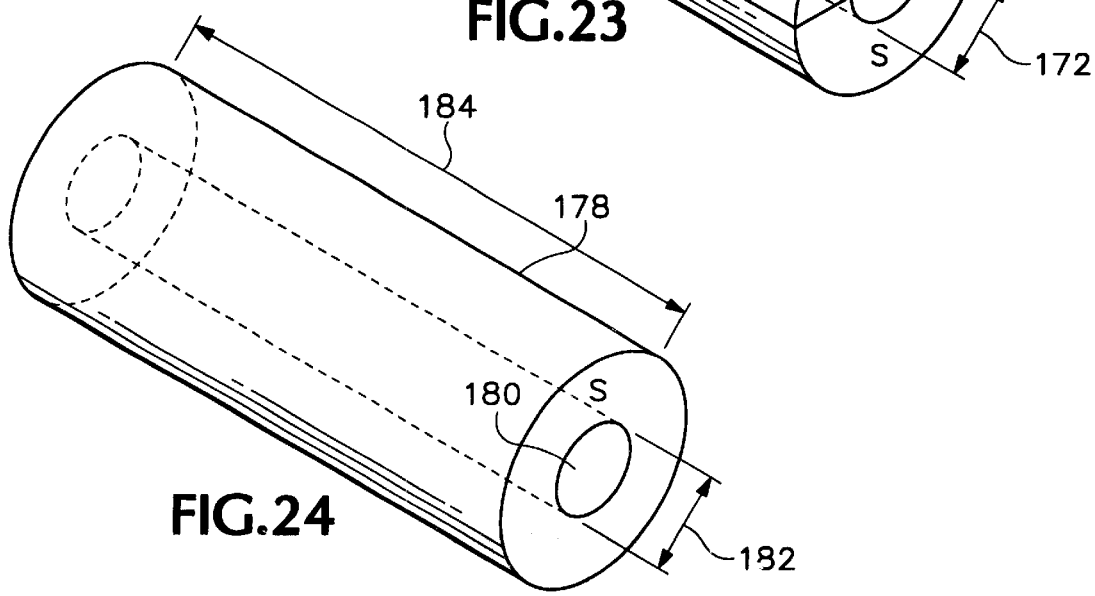
FIG. 24 is a perspective view of a tubular magnet for use in accordance with the present invention.

Additional forms of permanent magnets useful in accordance with the present invention are shown in FIGS. 23 and 24. In FIG. 23, a pair of similar permanently magnetized magnets 166 and 168 have the form of identical halves of a tube and are mated with each other along a plane bisecting the tube along a diameter thereof. The magnets 166 and 168 define a centrally located axially extending cable passageway 170 having a diameter 172 preferably fitting fairly snugly about a cable (not shown) with which it is intended to use the pair of magnets 166 and 168. As shown, the magnets 166 and 168 are longitudinally polarized so that each has an axis of polarity parallel with the length 174 of the tube formed by the pair of magnets, with the south poles of both of the magnets 166 and 168 at one end of the pair of magnets, as shown in FIG. 23, and the north pole of each magnet being located at the opposite end.

In FIG. 24, a single tubular permanent magnet 178 defines an open tubular cable passageway 180 whose diameter 182 is preferably large enough to allow an electrical conductor cable (not shown) to be extended through the cable passageway 180 so that the cable fits snugly within the cable passageway 180 without excessive space between the exterior of the cable and the interior of the cable passageway 180. This, of course, may require insertion of the cable through the magnet 178 before terminals are affixed to the cable. Preferably, the magnet 178 is magnetized with a south pole at one end and the north pole at the opposite end, to define an axis of polarity parallel with the length 184 of the magnet, as shown in FIG. 24.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An electronic noise attenuator for use with an electrical conductor cable for an electronic device, comprising:

(a) a case defining an elongate cable-receiving passageway including a passageway axis;

(b) at least one permanently magnetized magnet located within said case adjacent said cable-receiving passageway, each said magnet having a pair of ends and each of said ends including a respective one of a pair of magnetic poles defining a linear axis of polarity of a respective said magnet extending parallel with said passageway axis; and (c) a tubular shield of ferromagnetic material extending at least partially around said at least one magnet and said passageway and extending beyond said at least one magnet toward said cable-receiving passageway.

2. The electronic noise attenuator of claim 1, wherein said case includes a pair of mating parts and said at least one magnet includes two elongate magnets, a respective one of said elongate magnets being located within each of said parts of said case, said pair of poles of each of said elongate magnets consisting of a respective pole at each end of each of said elongate magnets, and wherein said cable-receiving passageway is located between said parts of said case.

3. The electronic noise attenuator of claim 2 wherein said cable-receiving passageway is located between said elongate magnets.

4. The electronic noise attenuator of claim 1, said at least one permanently magnetized magnet including a plurality of elongate magnets, each of said plurality of elongate magnets being one of a set of mating sectors of a tube having a pair of opposite ends, said set of mating sectors being held together by said case and thereby forming a tube surrounding said cable-receiving passageway, said pair of poles of each of said plurality of elongate magnets consisting of a respective pole at each end of each of said elongate magnets, and like poles of said plurality of elongate magnets being located adjacent each other at each end of said tube.

5. An electronic noise attenuator for use with an electrical conductor cable of an electronic device, comprising:
   (a) a case defining cable-receiving passageway;
   (b) at least one permanently magnetized magnet located within said case adjacent said cable-receiving passageway; and
   (c) a unitary body of electrically conductive magnetically permeable ferromagnetic material contained within said case in proximity with said permanently magnetized magnet, said ferromagnetic material extending partially around said magnet and around at least a portion of said cable-receiving passageway.

6. An electronic noise attenuator for use with an electrical conductor cable of an electronic device, comprising:
   (a) a case defining cable-receiving passageway, said case having a connected mating pair of similar halves each partially defining said cable-receiving passageway; (b) each of said halves containing respectively at least one permanently magnetized magnet located within said case adjacent said cable-receiving passageway; and
   (c) a body of magnetically permeable ferromagnetic material contained within said case in proximity with said permanently magnetized magnet, said body of magnetically permeable ferromagnetic material including a pair of shield members each housed in a respective one of said halves of said case, said shield members being aligned opposite each other, with each said permanently magnetized magnet being located between a respective one of said shield members and said cable-receiving passageway and said ferromagnetic material extending partially around said magnet and around at least a portion of said cable-receiving passageway, each said shield member being magnetically attached to a respective one of said permanently magnetized magnets and said permanently magnetized magnets being oriented so as to repel each other.

7. An electronic noise attenuator for use with an electrical conductor cable of an electronic device, comprising:
   (a) a case defining cable-receiving passageway, said case having a connected mating pair of similar halves each partially defining said cable-receiving passageway;
   (b) each of said halves containing respectively at least one permanently magnetized magnet located within said case adjacent said cable-receiving passageway; and
   (c) a body of magnetically permeable ferromagnetic material contained within said case in proximity with said permanently magnetized magnet, said body of magnetically permeable ferromagnetic material including a pair of shield members each housed in a respective one of said halves of said case, said shield members being aligned opposite each other, with each said permanently magnetized magnet being located between a respective one of said shield members and said cable-receiving passageway and said ferromagnetic material extending partially around said magnet and around at least a portion of said cable-receiving passageway, and said halves of said case being interconnected with each other by a plurality of threaded fasteners.

8. An electronic noise attenuator for use with an electrical conductor cable of an electronic device, comprising:
   (a) a case defining cable-receiving passageway, said case having a connected mating pair of similar halves each partially defining said cable-receiving passageway;
   (b) each of said halves containing respectively at least one permanently magnetized magnet located within said case adjacent said cable-receiving passageway; and
   (c) a body of magnetically permeable ferromagnetic material contained within said case in proximity with said permanently magnetized magnet, said body of magnetically permeable ferromagnetic material including a pair of shield members each housed in a respective one of said halves of said case, said shield members being aligned opposite each other, with each said permanently magnetized magnet being located between a respective one of said shield members and said cable-receiving passageway and said ferromagnetic material extending partially around said magnet and around at least a portion of said cable-receiving passageway, said shield members being of sheet steel thick enough and permeable enough not to be saturated magnetically by said permanently magnetized magnet.

9. The electronic noise attenuator of claim 8 wherein said shield members are shaped as respective channels facing openly toward each other around said at least one permanently magnetized magnet and said cable-receiving passageway.

10. The electronic noise attenuator of claim 9 wherein each of said shield members includes a pair of legs defining said channel thereof, said legs having respective margins, and each of said shield members being located with said margin of each leg abutting against said margin of a respective leg of said shield member housed in said other half of said case.

* * * * *

UNITED STATES PATENT AND TRADEMARK OFFICE
CERTIFICATE OF CORRECTION

PATENT NO. : 6,469,594 B1  Page 1 of 1
DATED : October 22, 2002
INVENTOR(S) : Victor M. Tiscareno It is certified that error appears in the above-identified patent and that said Letters Patent is hereby corrected as shown below:

Title page,
Item [12], change "Ticarano" to read -- Tiscareno --.
Item [75], change "Victor M. Ticarano" to read -- Victor M. Tiscareno --.

Column 1,
Line 35, change "citizens, band transceivers" to read -- citizens' band transceivers --.

Column 3,
Line 24, change "shown if FIG.1" to read -- shown in FIG. 1 --.

Signed and Sealed this

Twenty-first Day of October, 2003

JAMES E. ROGAN
*Director of the United States Patent and Trademark Office*